(12) United States Patent
Guenard et al.

(10) Patent No.: US 7,981,767 B2
(45) Date of Patent: Jul. 19, 2011

(54) METHODS FOR RELAXATION AND TRANSFER OF STRAINED LAYERS AND STRUCTURES FABRICATED THEREBY

(75) Inventors: Pascal Guenard, Froges (FR); Bruce Faure, Paris (FR); Fabrice Letertre, Meylan (FR); Michael R. Krames, Los Altos, CA (US); Nathan F. Gardner, Sunnyvale, CA (US); Melvin B. McLaurin, Mountain View, CA (US)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 297 days.

(21) Appl. No.: 12/341,852

(22) Filed: Dec. 22, 2008

(65) Prior Publication Data
US 2010/0032793 A1 Feb. 11, 2010

(30) Foreign Application Priority Data
Aug. 6, 2008 (EP) ..................................... 08290759

(51) Int. Cl.
*H01L 33/00* (2010.01)
(52) U.S. Cl. ................. 438/458; 257/E33.001
(58) Field of Classification Search ............. 438/55–62, 438/458–462, 623, 795; 257/E33.001
See application file for complete search history.

(56) References Cited

U.S. PATENT DOCUMENTS

| | | | |
|---|---|---|---|
| 4,994,867 A | 2/1991 | Biegelsen | 357/16 |
| 5,391,257 A | 2/1995 | Sullivan et al. | 156/630 |
| 5,670,411 A | 9/1997 | Yonehara et al. | 437/62 |
| 6,214,733 B1 | 4/2001 | Sickmiller | 438/691 |
| 6,406,795 B1 | 6/2002 | Hwang et al. | 428/457 |
| 6,794,276 B2 | 9/2004 | Letertre et al. | 438/506 |
| 7,018,909 B2 | 3/2006 | Ghyselen et al. | 438/455 |
| 7,273,798 B2 | 9/2007 | Lester et al. | 438/458 |
| 7,282,381 B2 | 10/2007 | Feltin et al. | 438/46 |
| 7,585,792 B2 | 9/2009 | Celler | 438/795 |
| 7,736,935 B2 | 6/2010 | Faure et al. | 438/59 |
| 2003/0064535 A1 | 4/2003 | Kub et al. | 438/22 |
| 2004/0192067 A1 | 9/2004 | Ghyselen et al. | 428/763 |

(Continued)

FOREIGN PATENT DOCUMENTS
EP 0651439 5/1995
(Continued)

OTHER PUBLICATIONS

Hobart et al. "Compliant Substrates: A Comparative Study of the Relaxation Mechanisms of Strained Films Bonded to High and Low Viscosity Oxides", Journal of Electronic Materials, vol. 29, No. 7, pp. 897-900 (2000).*

(Continued)

*Primary Examiner* — Thomas L Dickey
(74) *Attorney, Agent, or Firm* — Winston & Strawn LLP

(57) ABSTRACT

The present invention provides methods for forming at least partially relaxed strained material layers on a target substrate. The methods include forming islands of the strained material layer on an intermediate substrate, at least partially relaxing the strained material islands by a first heat treatment, and transferring the at least partially relaxed strained material islands to the target substrate. The at least partial relaxation is facilitated by the presence of low-viscosity or compliant layers adjacent to the strained material layer. The invention also provides semiconductor structures having an at least partially relaxed strained material layer, and semiconductor devices fabricated using an at least partially relaxed strained material layer.

19 Claims, 3 Drawing Sheets

U.S. PATENT DOCUMENTS

| | | | |
|---|---|---|---|
| 2004/0253792 A1 | 12/2004 | Cohen et al. | 438/400 |
| 2005/0250294 A1 | 11/2005 | Ghyselen | 438/458 |
| 2006/0094140 A1 | 5/2006 | Inoguchi et al. | 438/22 |
| 2006/0128117 A1 | 6/2006 | Ghyselen et al. | 438/455 |
| 2006/0175608 A1 | 8/2006 | Celler | 257/49 |
| 2006/0205180 A1 | 9/2006 | Henley et al. | 438/458 |
| 2006/0211219 A1 | 9/2006 | Henley et al. | 438/458 |
| 2007/0048975 A1 | 3/2007 | Chen et al. | 438/478 |
| 2007/0069225 A1 | 3/2007 | Krames et al. | 257/94 |
| 2007/0072324 A1 | 3/2007 | Krames et al. | 438/46 |
| 2007/0241353 A1 | 10/2007 | Taki | 257/94 |
| 2007/0278622 A1 | 12/2007 | Lester et al. | 257/615 |
| 2007/0298549 A1 | 12/2007 | Jurczak et al. | 438/149 |
| 2008/0113496 A1 | 5/2008 | Keller et al. | 438/481 |
| 2008/0169483 A1 | 7/2008 | Kasai et al. | 257/183 |
| 2009/0050917 A1 | 2/2009 | Nakagawa et al. | 257/98 |
| 2009/0261344 A1 | 10/2009 | Celler | 257/75 |
| 2010/0032805 A1 | 2/2010 | Letertre et al. | 257/615 |

FOREIGN PATENT DOCUMENTS

| | | |
|---|---|---|
| EP | 0 858 110 A1 | 8/1998 |
| EP | 1 378 591 A1 | 1/2004 |
| EP | 1 671 361 B1 | 4/2007 |
| EP | 1901345 | 3/2008 |
| FR | 2775121 | 8/1999 |
| FR | 2895420 | 6/2007 |
| FR | 2895562 | 6/2007 |
| WO | WO 2004/077552 A1 | 9/2004 |

OTHER PUBLICATIONS

European Search Report for EP 08 29 0759 dated Apr. 14, 2009.

Notice of Allowance dated Feb. 24, 2010, U.S. Appl. No. 12/341,806, filed Dec. 22, 2008.

Feng et al., "Stress Generation and Relaxation during Film Heteroepitaxy on a Compliant Substrate with a Viscoelastic Glass Interlayer," Mat. Res. Soc. Symp. Proc., 696:N3.19.1-N3.19.6 (2002).

Hansen et al., "Development of a glass-bonded compliant substrate," Journal of Crystal Growth, 195:144-150 (1998).

Moran et al., "Kinetics of Strain Relaxation in Semiconductor Films Grown on Borosilicate Glass-Bonded Substrates," Journal of Electronic Materials, 30(7):802-806 (2001).

Haizhou Yin et al., "Tunable Uniaxial Vs Biaxial In-Plane Strain Using Compliant Substrates", Applied Physics Letters, vol. 87, pp. 061922-1-061922-3 (2005).

R. Huang et al., XP009112211, "Mechanics of Relaxing SiGe Islands on a Viscous Glass," Acta Mechanica Sinica (English Series), vol. 18, No. 5, pp. 441-456 (2002).

European Search Report for EP08290757.7 dated Mar. 16, 2009.

Haizhou Yin et al., "Fully-depleted Strained-Si on Insulator NMOSFETs without Relaxed SiGe Buffers", IEDM International Electron Devices Meeting, pp. 03-53-03-56 (2003).

C. X. Peng et al., "Influence of GaN polarity and intermediate-temperature buffer layers on strain relaxation and defects", PHYSICA B vol. 391, No. 1, pp. 6-11 (2007).

Hobart, K.D. et al., "Compliant Substrates: A Comparative Study of the Relaxation Mechanisms of Strained Films Bonded to High and Low Viscosity Oxides", Journal of Electronic Materials, vol. 29, No. 7, pp. 897-900 (2000).

L. Di Cioccio et al., "III-V Layer Transfer Onto Silicon and Applications", Phys. Stat. Sol., vol. (a) 202, No. 4, pp. 509-515 (2005).

M. Kostrzewa et al, "Feasibility of Strain Relaxed InAsP and InGaAs Compliant Substrates", pp. 437-440 (2003).

P. M. Mooney et al., "Elastic Strain Relaxation in Free-Standing SiGe/Si Structures", Applied Physics Letters, vol. 84, No. 7, pp. 1093-1095 (2004).

Haizhou Yin et al., "Buckling Suppression of SiGe Islands on Compliant Substrates", Journal of Applied Physics, vol. 94, No. 10, pp. 6875-6882 (2003).

Haizhou Yin et al., "Strain Relaxation of SiGe Islands on Compliant Oxide", Journal of Applied Physics, vol. 91, No. 12, pp. 9716-9722 (2002).

International Search Report mailed Sep. 23, 2009 for Application No. PCT/EP2009/004790 filed Jul. 2, 2009.

International Search Report mailed Mar. 25, 2010 for Application No. PCT/EP2009/005694 filed Aug. 6, 2009.

Non-Final Office Action (Restriction Requirement) mailed Dec. 9, 2010 for U.S. Appl. No. 12/341,722 filed Dec. 22, 2008.

Non-Final Office Action mailed Mar. 2, 2011 for U.S. Appl. No. 12/341,722 filed Dec. 22, 2008.

U.S. Appl. No. 12/341,722 filed Dec. 22, 2008.
U.S. Appl. No. 12/341,806 filed Dec. 22, 2008.
U.S. Appl. No. 13/055,123 filed Jan. 20, 2011.
U.S. Appl. No. 13/056,572 filed Mar. 4, 2011.

* cited by examiner

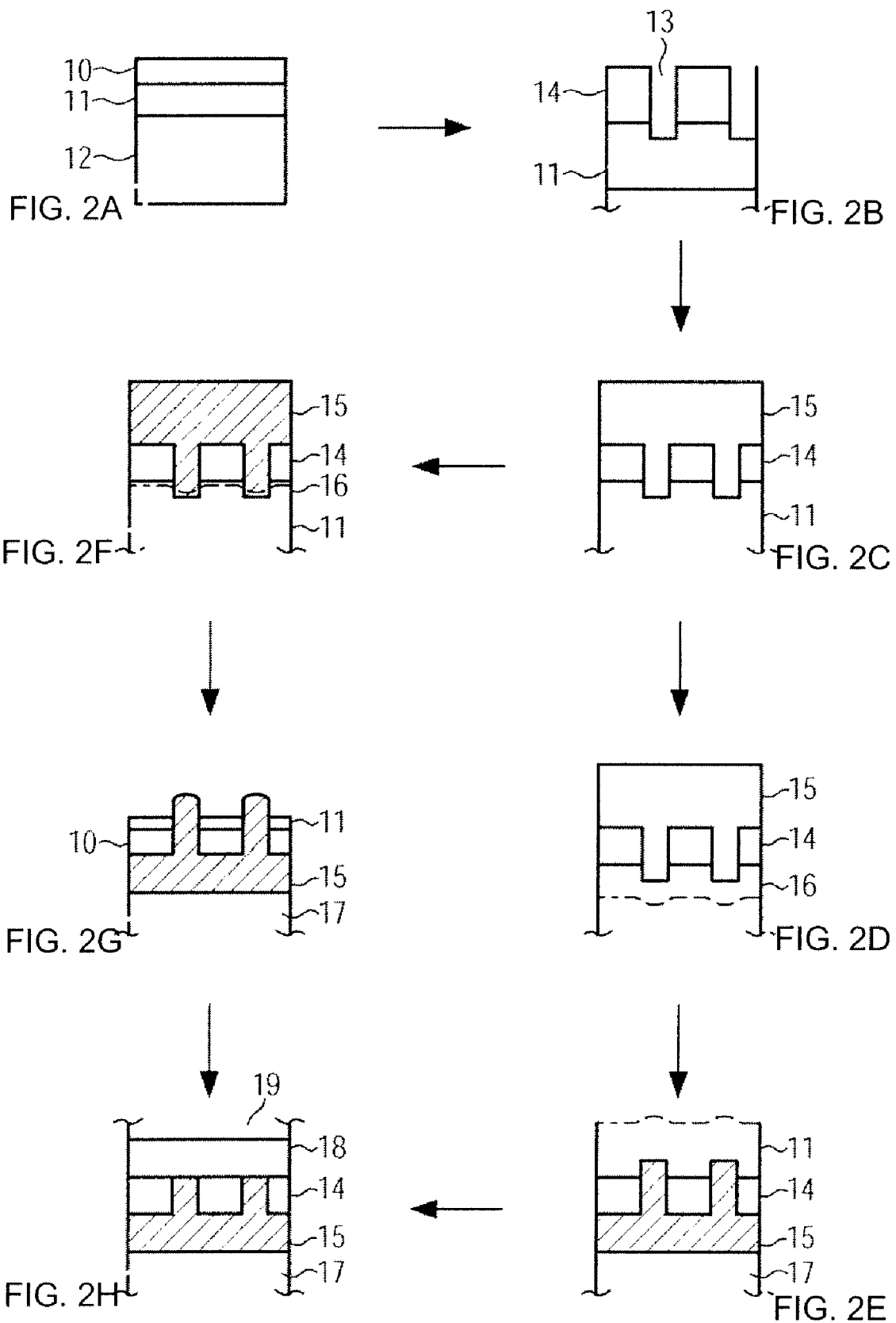

METHODS FOR RELAXATION AND TRANSFER OF STRAINED LAYERS AND STRUCTURES FABRICATED THEREBY

FIELD OF INVENTION

The present invention relates to the field of semiconductor useful for the fabrication of semiconductor devices and, in particular, provides methods for the relaxation of strained hetero-epitaxially-grown islands arranged on one or more layers of a compliant material, and for the transfer of the at least partially relaxed strained islands to a support substrate suitable for further semiconductor manufacturing processes.

BACKGROUND OF THE INVENTION

When native bulk substrates are not available or are too expensive, materials useful for semiconductor devices are often formed by heteroepitaxy on seed substrates. The seed substrates often have unsuitable atomic lattice spacing and coefficients of thermal expansion with respect to the material to be grown that can result in detrimental effects on material quality. For example, layers grown on seed substrates can have high dislocation densities, cracks, and compression or tensile strains, all of which lead to reduced efficiency of devices subsequently manufactured on them.

Thus, in the art, compliant layers, e.g., low-viscosity layers, have been provided between hetero-epitaxial films and final substrates so that strains can be released by subsequent heat treatment. See, e.g., Hobart, K. D. et al., "Compliant Substrates: A Comparative Study of the Relaxation Mechanisms of Strained Films Bonded to High and Low Viscosity Oxides", Journal of Electronic Materials, Volume 29, No. 7, 2000, pages 897-900.

However, presently used methods for the relaxation of strained hetero-epitaxially-grown films often not show satisfying results with respect to the suppression of buckling, etc. Moreover, the transfer of heteroepitaxial films grown on a seed substrate (or growth substrate) to a final substrate for the manufacture of semiconductor devices is beset by problems, including the problems of maintaining the heteroepitaxial films intact, and of removing the seed substrate without damaging the heteroepitaxial films.

Therefore, improved methods for the formation of reliably relaxed and intact strained films, or islands of such films, on target substrates that have the quality required for the fabrication of semiconductor devices would be advantageous.

SUMMARY OF THE INVENTION

The present invention provides novel methods for the formation of reliably relaxed and intact strained films, or islands of such films, on target substrates that have the quality required for the fabrication of semiconductor devices. The invention also provides structures formed by these methods and devices fabricated from the structures. A "strained material" is used herein to refer to a material having lattice parameters that are different from the material's nominal lattice parameters (taking account measurement mistakes). This strain may be in tension or in compression. "Strained material" can refer to a layer of strained material of to islands formed from a layer of strained material. The strained material is preferably a semi-conductor material such as Group III-V material, in particular Group III-nitride materials, or a ternary or quaternary alloy of Group III-nitride materials. Such Group III-V materials can be polar, non-polar, or semipolar.

In preferred embodiments, the provided methods include forming islands of a strained material layer on an intermediate substrate, then at least partially relaxing the strained islands by a first heat treatment; and finally transferring the at least partially relaxed strained islands to a target substrate. The islands allow for a more efficient relaxation during heat treatment without significant buckling as compared to a continuous strained layer. The term "patterning" refers to the formation of islands separated by interspaces (trenches).

The invention also provides semiconductor structures devices that can be fabricated by the methods of this invention. In preferred embodiments, the provided structures are wafer shaped and include a support structure (e.g., of sapphire), a high-viscosity layer, and islands of at least partly relaxed strained material, in particular, with an area size from 100 micrometers×100 micrometers to 1 mm×1 mm and a thickness of not more than 1000 Angstroms.

The invention also provides semiconductor devices that can be fabricated using at least partially relaxed strained material layers. Thus, the invention further provides a method for fabricating semiconductor devices by fabricating an at least partially relaxed strained material on a target substrate according to the methods of this invention, and then epitaxially or homo-epitaxially growing a material layer on the formed at least partially relaxed strained material islands. The growth technique may include the epitaxial lateral overgrowth that allows growth of continuous material layers from material islands.

Additional features and advantages of the present invention will be described with reference to the drawings. In the description, reference is made to the accompanying figures that are meant to illustrate preferred embodiments of the invention. It is understood that such embodiments do not represent the full scope of the invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which:

FIGS. 2A-H illustrates exemplary steps of a further preferred embodiment of the methods of the invention.

DETAILED DESCRIPTION OF PREFERRED EMBODIMENTS OF THE INVENTION

Figure 1A:
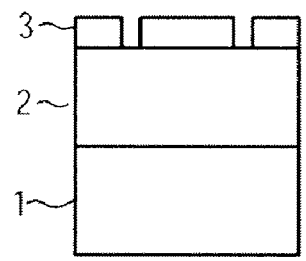
FIGS. 1A-E illustrates exemplary steps of a preferred embodiment of the methods of the invention.
Figure 1C:
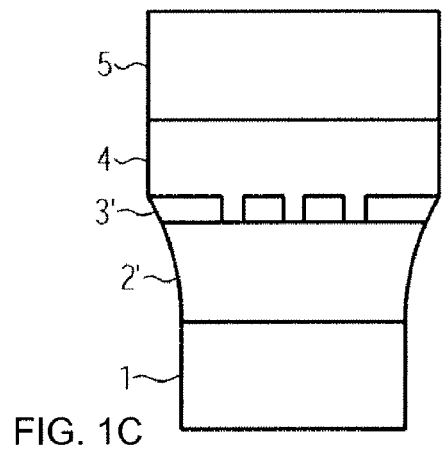
Figure 1B:
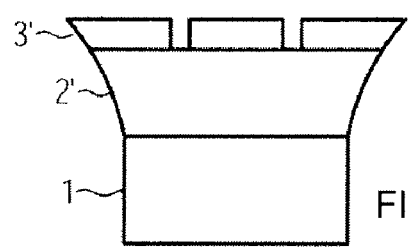
Figure 1D:
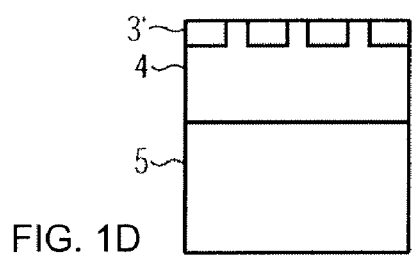
Figure 1E:
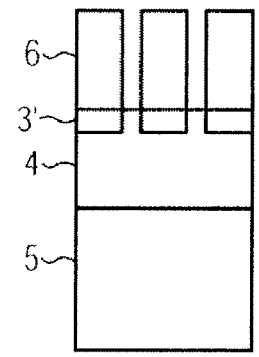

The present methods provide for the formation of reliably relaxed and intact strained films, or islands of such films, on target substrates that have the quality required for the fabrication of semiconductor devices. These methods generally include forming islands from a strained material layer on an intermediate substrate; performing a first heat treatment so as to at least partially relax the strained material islands; and transferring the at least partially relaxed strained material islands to the target substrate.

When the strained material is polar, as for the c-plane Group III-nitride material, and when the methods, first, grow the strained material on a seed substance and then perform a two-step transfer process, the polarity of the face of the relaxed strained material opposing the growth face (i.e., the buried face during growth) on the seed substance can be maintained so that is suitable for subsequent epitaxial growth of layers. A "two-step transfer" process here refers to methods including transferring a layer of a strained material is transferred from a seed substance to an intermediate substance, i.e., the substrate on which islands of the strained material are formed, and then from the intermediate substance to a target substance. It is noted that the strained material layer may be grown on a seed substrate or a seed layer bonded to or deposited on the seed substrate.

Relaxation of the strained material can be performed one or more times while it is on the seed substrate, or on the intermediate substrate, or on the target substrate. Thereby, the provided methods are more flexible than the prior art in regards to the process of the relaxation of the strained material layer. For example, in some embodiments, the relaxation of the strained material layer, be it partial or complete relaxation, can be entirely performed on the intermediate substrate. Thus, on transfer to the target substrate, further heat treatment is not necessary to further relax the already relaxed strained layer, and buckling of the already transferred at least partially relaxed strained layer is avoided. In other embodiments, however, the methods of the invention comprise heat treatment can be performed after transfer to the target substrate to further relax the at least partially relaxed strained layer, if desired.

Relaxation can be facilitating by depositing a compliant, or low-viscosity material adjacent to the strained layer. A first compliant layer can be deposited prior to the first heat treatment on the intermediate substrate, and a second compliant layer can be deposited prior to an optional heat treatment on the target substrate. The term "compliant" or "low-viscosity" material is used herein to refer to materials that show some reflow when temperatures during heat treatment exceed the material's glass transition temperature. The term "reflow" (or "melting flow") is used herein to refer to changes in the compliant material, e.g., viscous flow, that occur relaxation during heat material of a strained material layer deposited on the compliant layer.

Suitable compliant materials include borophosphosilicate glass (BPSG) or a compound or mixture comprising $SiO_2$ and B to form a borosilicate glass (BSG) or P to form a phosphosilicate glass (PSG). For example, many low-viscosity oxide materials have a glass transition temperature around 600-700° C. The glass transition temperature of a low-viscosity BPSG layer with 4.5% by weight of boron and 2% by weight of phosphorous is about 800° C. The glass transition temperature of the high-viscosity oxide material is above 1000° C. and preferably above 1200° C.

Furthermore, when the strained material layer is grown on a seed substrate and then transferred to an substrate, the strained material layer can be patterned by forming islands separated by interspaces (trenches) before transfer from the seed substrate to the intermediate substrate. The step of transferring can then comprise, first, depositing a low-viscosity layer (or a compliant layer), in particular, an oxide layer or a polymer layer, on the islands of strained material, and then bonding the low-viscosity oxide layer to the intermediate substrate. In this case, the low-viscosity (or complaint) layer is deposited both for at least partial relaxation of the strained material layer and for bonding to an intermediate layer. The low-viscosity layer can comprise a plurality different individual sub-layers, at least one of which comprises compliant material or low-viscosity layer (relaxing layer).

Similarly, the step of transferring the at least partially relaxed strained material layer from the intermediate substrate to the target substrate can comprise, first, depositing a high-viscosity layer (e.g. a second buried layer such as an oxide layer) on the at least partially relaxed strained material (or islands of the least partially relaxed material), and then, bonding the high-viscosity layer to the target substrate.

The strained material layer can also be patterned after transferring from the seed substrate to the intermediate substrate. The interspaces separating the strained material islands then can extend down to the intermediate substrate. Some predetermined thickness of low-viscosity material can be left in the trenches. However, it is particularly advantageous that substantially no portion of the low-viscosity layer remain on the bottom of the interspaces, this is to etch the interspaces (trenches) down to the intermediate substrate, or even into the intermediate substrate. In the latter case, the low-viscosity layer remains only on the exposed sidewalls of the interspaces. Thereby, the relaxation step is improved, and diffusion of constituents of the low-viscosity layer (e.g. B and P atoms) is reduced.

Patterning of the strained material layer may also be performed at an even later step of the disclosed methods. For example, a second buried layer (e.g., a high-viscosity layer) is deposited on the strained material layer, both the second buried layer and the strained material layer are patterned before at least partially relaxing the strained material layer. This embodiment facilitates bonding to the target substrate at the islands only.

In further embodiments, detachment of the strained material from a seed substrate can be facilitated by the implantation of ions resulting in a weakened layer and subsequent heat treatment in order to intentionally cause cracking at the weakened layer. Accordingly, the methods provided by this invention also include growing the strained material layer on a seed substrate, then before patterning, implanting ions in the seed substrate below the strained material layer to form a weakened layer. In this case, the weakened layer can be entirely formed within the seed layer so that it has a homogeneous (smooth) profile (ion implantation profile). A homogenous ion implantation profile can be advantageous with respect to detachment with clear edges.

In further embodiments, the weakened layer can be formed in the strained layer with a homogenous ion implantation profile. A low-viscosity layer can be then deposited on the islands so that the trenches are not completely filled; the islands can be bonded to the intermediate substrate and detached at the weakened zone; and finally the low-viscosity layer and the strained material can be detached from the seed substrate at the weakened layer by a third heat treatment at a temperature that is preferably below the reflow temperature of the first compliant material. Patterning can be performed after the transfer.

In further embodiments, the weakened layer comprises portions at the bottom of the interspaces filled with the low-viscosity layer (buried layer), and the surface after transferring can require significant planarization before bonding and transferring onto the target substrate. Accordingly, in further preferred embodiments, the methods provided by this invention also include growing the strained material layer on a seed layer (optionally deposited on the seed substrate); then patterning of the strained material layer; then depositing the buried layer (i.e., the low-viscosity layer) on the strained material islands and in the interspaces separating the strained material islands; then implanting ions in the seed layer below the strained material islands and in the buried layer at the bottom of the interspaces separating the strained material islands to form a weakened layer; then performing a third heat treatment at a temperature preferably below the reflow temperature of the first compliant material in order to form cracks at the weakened layer; then detaching the buried layer and the strained material layer from the seed substrate at the weakened layer; and finally transferring those layers onto the intermediate substrate. To avoid significant planarization, the implantation can be performed at a depth below the islands, below the compliant material, and directly in the seed material. In such a case, residual seed material need only be etched before bonding onto the target substrate.

In further embodiments, the seed substrate and the intermediate substrate and/or the intermediate substrate and the target substrate comprise similar or the same materials, e.g., silicon, sapphire, SiC, or Ge, such that the coefficients of thermal expansion of the various substrates are the same. Then, little or no tension due to different thermal expansion is applied to the layer sandwiched between the substrates during a heat treatment (e.g., the above-mentioned third heat treatment performed for the detachment of the seed substrate).

In further embodiments, detachment can be performed by laser lift-off. Then, the low-viscosity layer and/or the high-viscosity layer (the first buried layer and/or the second buried layer) can comprise an absorption layer suitable for absorbing electromagnetic radiation and thereby facilitating detachment. The absorption layer of the first buried layer can be arranged at the interface of the low-viscosity layer (first buried layer) and the intermediate substrate, and the absorption layer of the second buried layer can be arranged at the interface of the high-viscosity layer (second buried layer) and the target substrate in order to avoid damage of the strained material layer and the at least partially relaxed strained material layer, respectively, during the detachment process.

In preferred embodiments, the strained material layer comprises or consists of InGaN. This material is particularly useful for the manufacture of LEDs and solar cells, since it absorbs a broad wavelength range of solar light (in particular, in the green, blue and ultraviolet range). Accordingly, in these preferred embodiments, the methods provided by this invention also include forming an at least partially relaxed strained InGaN layer on a substrate by growing a strained InGaN layer on a seed substrate and then transferring the strained InGaN layer from the seed substrate to an intermediate substrate. Transferring preferably includes depositing a low-viscosity layer, in particular, a first buried compliant layer, on the strained InGaN layer; bonding the first buried compliant layer to the intermediate substrate; detaching the seed substrate; patterning the strained InGaN layer after transferring it from the seed substrate to the intermediate substrate thereby forming strained InGaN islands separated by interspaces; at least partially relaxing the strained InGaN islands transferred to the intermediate substrate by a first heat treatment that results in some reflow of the compliant material; and finally transferring the relaxed islands to a target substrate. The strained InGaN may be relaxed, patterned, and transferred in any order.

Borophosphosilicate glass exhibits desirable reflow characteristics at temperatures exceeding about 800° C. or 850° C. (depending on the actual composition of the glass) thereby allowing for relaxation of the strained layer of InGaN or other material. Depending on the trench width, the strained material islands may form a sensibly continuous layer after relaxation of material. Adherence of the deposited buried layer comprising borophosphosilicate glass can advantageously be improved by depositing an $SiO_2$ layer on the Ga face of a strained InGaN layer (or different strained material layer) before the BPSG deposition.

US patent application Ser. No. 12/341,722, titled "METHODS AND STRUCTURES FOR RELAXATION OF STRAINED LAYERS", by Fabrice LETERTRE and Carlos MAZURE, and assigned to the assignee of the present application is incorporated herein by reference in its entirety for all purposes.

US patent application Ser. No. 12/341,806, titled "PASSIVATION OF SEMICONDUCTOR STRUCTURES HAVING STRAINED LAYERS", by Bruce FAURE and Pascal GUENARD, and assigned to the assignee of the present application is incorporated herein by reference in its entirety for all purposes.

In the following, examples for the formation of relaxed islands of a strained material layer and the transfer of these islands in accordance with the present invention are explained with reference to the accompanying Figures. According to FIGS. 1A-E support substrate 1 is provided. Support substrate 1 can comprises a semiconductor material comprising Si, SiC, Ge, etc. or it can be sapphire support. Atop of support substrate 1, buried layer 2 is formed. The buried layer may be composed of different individual layers and comprises at least compliant layer (relaxing layer, low-viscosity layer). The compliant layer includes without limitation borophosphosilicate glass (BPSG) or an $SiO2$ compound comprising B (BSG) or P (BPG). The reflow rate can readily be adjusted by the B or P content.

More generally, the compliant layer comprises a material that can be plastically deformed and reflow when subjected to thermal treatment (as, e.g., an annealing process). The reflow leads to complete or partial relaxation of the strained material islands 3 that are bonded by the buried layer 2 to the support substrate 1. The strained material islands 3 are formed by patterning of a strained layer formed atop of the buried layer 2 comprising the compliant material layer. The strained material islands can, in particular, comprise or consist of InGaN. The shapes of the strained material islands 3 are arbitrary, in principle, and might be chosen to be circular or rectangular for ease of manufacture. Depending on the size of the surface of islands to relax, at least a hole can be preferable in the islands to improve material relaxation without buckling. The hole may be of any shape such as circular, square or star shape and may be repeated in the same strained island. Moreover, the spaces (trenches) between the strained material islands 3 might be filled with material of buried layer 2. Details of the manufacture of the structure A comprising support substrate 1, buried layer 2 and strained material islands 3 are described below.

When the structure A is subject to thermal treatment, the compliant portion of buried layer 2 is plastically deformed and exhibits reflow and plastically deformed buried layer 2' is obtained. The lateral deformation results in at least partially and elastically relaxing islands 3' thereby preventing buckling. Indeed, surface roughness, that might be affected by buckling, is preferably low for further applications. For an epitaxial growth for LED, the surface roughness after relaxation is preferably limited to 20 nm RMS measured by AFM.

Next, second buried layer 4 is formed on top and between the at least partially relaxed islands 3'. Second buried layer 4 is used for bonding the at least partially relaxed islands 3' to second support substrate 5. Second buried layer 4 preferably does not include contaminating elements that readily diffuse out of layer 4 under thermal treatments that are often performed during subsequent processing steps, in particular, annealing for initiating detachment. Second buried layer 4 shall particularly be devoid of boron or any contaminating elements that could deteriorate the quality of LED elements formed on the at least partially relaxed islands 3', for example, when diffused in some heat treatment environment. Second buried layer 4 preferably, however, comprises some compliant material allowing for further relaxation of the at least partially relaxed islands 3' after transfer to second support substrate 5.

Both buried layer 2 and second buried layer 4 preferably comprise an absorbing layer for absorbing electromagnetic radiation at wavelengths for which the respective support substance is transmissive in order to enable detachment from the at least partially relaxed islands 3' and thereby removal of support substrate 1 or 5, respectively. Such an absorbing layer is preferably provided at the interface of the respective buried layer and the respective substrate and it may be formed of SixNy:H, for example.

Substrate 1 together with buried layer 2 is subsequently detached to form structure B comprising second substrate 5, second buried layer 4 and the at least partially relaxed islands 3'. The at least partially relaxed islands 3' can subsequently be used for the epitaxial growth of structured material layer 6 and, in particular, for epitaxial or homoepitaxial growth of a crystalline layer, that is to be employed in the manufacture of a particular semiconductor device useful in electronic, photovoltaic or opto-electronic applications such as LEDs or lasers.

When a double-transfer of the patterned (partially relaxed) strained layer, i.e. the islands 3 and 3', respectively, is performed first to first support substrate 1 and then to second support substrate 5, the polar structure of the strained material (if a polar material is provided) as grown on a seed substrate (see below) is maintained in structure B. It is advantageous in particular for polar Group III-nitride materials to have face of the polarity of the Group III element(s) exposed for easy epitaxial growth on the relaxed islands. This face is also the face that is generally provided after epitaxy on a seed substrate. It should be noted that whereas according to the present example, the (partial) relaxation of strained material islands 3 is performed by heat treatment of structure A and before transfer to second support substrate 5, in principle, the at least partial relaxation of the strained material islands 3 may alternatively or additionally be facilitated by heat treatment of structure B, i.e., after transfer to second support substrate 5. However, herein the focus is laid on the transfer of already relaxed strained material islands 3'. Transfer from first support substrate 1 to second support substrate 5 can be performed, e.g., by bond and grind/etch back, bond and electromagnetic absorption, Smart Cut® or any other layer transfer mechanism known in the art.

Next, the formation of a structure similar to structure A shown in FIG. 1A in accordance with the present invention is explained in more detail with reference to FIGS. 2A-H. Strained material layer 10, e.g., of InGaN, is hetero-epitaxially grown on a seed layer 11, e.g., of GaN, formed atop of sapphire or SiC or silicon substrate 12 functioning as a seed substrate. The strained material may also be formed by epitaxy on a seed substrate that is a bulk substrate or that includes a seed layer bonded to a support substrate. The substrate is advantageously of the same material as the first support substrate 1 of FIGS. 1A-C to allow a matching of the coefficients of thermal expansion of these substrates when they are bonded and subject to heat treatment for subsequent detachment. The thickness of strained material layer 10 may be some 10s-100s of nm, for example. The formation and patterning of heteroepitaxial films, in general, is well-known in the art and the particular method used for such a formation is not at all crucial in the present invention. See, e.g., Hobart, K. D. et al., "Compliant Substrates: A Comparative Study of the Relaxation Mechanisms of Strained Films Bonded to High and Low Viscosity Oxides", Journal of Electronic Materials, Volume 29, No. 7, 2000, pages 897-900.

According to the example shown in FIG. 2B, strained material layer 10 is patterned by etching trenches 13 and thereby forming strained material islands 14. Trenches 13 can be etched down to support substance 12, alternatively seed material 11 can be maintained at some predetermined thickness. The trenches may, e.g., be spaced in intervals of 100 micrometers to 1 mm and may have widths of about 25 micrometers and depths of about 150 nanometers. Depending on the application widths and/or depths of the trenches may be in the range of some hundreds nanometers about these values.

Buried compliant layer 15 is deposited as known in the art in trenches 13 and atop of strained material islands 14. The thickness of buried layer 15 can be chosen such that surface irregularities are reduced, e.g., a thickness of three times the depths of the trenches is chosen.

Ion species are implanted in order to form ion implantation region 16 at the bottom of trenches 13 filled with buried material 15 and below strained material islands 14. Ion implantation results in a weakened bonding of buried layer 15 and strained material islands 14 to seed layer 11 and, thus, facilitates detachment from seed layer 11 after bonding to support substrate 17. Surface planarization may precede the step of ion implantation, if it is desired. Removal of the seed layer 11 can also be achieved by grinding.

If ion implantation is controlled such that the implantation depth exceeds the depths of the trenches (see the right hand side of FIGS. 2C-E), i.e. ion implantation completely in the seed material is performed, the implantation is more homogenous than in the case in that an implantation that also occurs into the buried material at the bottom of the trenches (see left hand side of FIGS. 2F-H). Due to the more homogenous implantation profile, surface planarization prior to the further processing such as the bonding of substrate 19 is less difficult.

It is noted that ion implantation may also be performed in the strained layer and patterning may be carried out when the strained layer is on the seed substrate or after transfer to the intermediate substrate.

After transfer to support substrate 17 heat treatment is performed in order to plastically deform compliant material layer 15. This deformation results in at least partially relaxed strained material islands 14. In order to further reduce any buckling, residuals (i.e. remaining portions) of seed layer 11 may be removed, e.g., by selective etching, after the heat treatment instead of performing removal prior to the relaxation step. The relaxed structure is subsequently bonded via second buried layer 18 to second support substrate 19. Depending on seed material 111 and to recover a sufficiently plane surface for the bonding, significant planarization can be required when the implantation profile has been performed in the compliant layer and in the seed material.

Figure 3A:
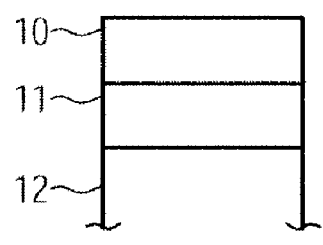
FIGS. 3A-C illustrates exemplary steps of a further preferred embodiment of the methods of the invention.
Figure 3B:
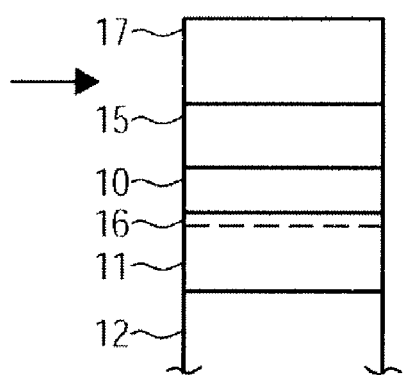
Figure 3C:
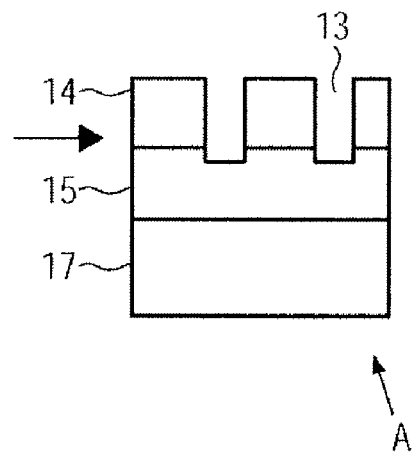

Whereas in the example shown in FIGS. 2E-H strained material islands 14 are separated by buried material 15, structure A shown in FIG. 1A results, if the step of patterning buried layer 15 is performed after the transfer of strained material islands 14 to first support substrate 17 (see FIGS. 3B, C). According to the example shown in FIGS. 3A-C, strained material layer 10 grown on seed layer 11 formed atop of substrate 12 is bonded via buried layer 15 to support substrate 17 and ion implantation down to strained material layer 10 or seed layer 11 results in weakened layer 16 with a rather homogeneous implantation profile (depth) thereby facilitating accurate detachment. Subsequently, trenches 13 are etched with depths of at least the thickness of strained material layer 10. Alternatively, the trenches can be formed through buried layer 15 down to first support substrate 17.

Next, a second buried layer (reference sign 18 of FIG. 2H) is formed for bonding to a second support substrate (reference sign 19 of FIG. 2H).

Alternatively, the step of patterning of strained material layer 10 may be carried out even later in the sequence of processing steps. Patterning can also be performed after the deposition of the second buried layer 18 results in bonding of individual strained material islands to the second support substrate.

Further, one might perform the patterning of strained material layer 10 after partial etching of seed layer 11 in order to adopt the thickness of seed layer 11 to the one of strained material layer 10. Heat treatment is then performed for the double layer stack consisting of the material of seed layer 11 and strained material layer 10 atop compliant layer 15. Subsequent final removal of the material of seed layer 11 may be accompanied by an additional annealing step to finish complete relaxation. Moreover, seed layer 11 may be partially etched and the heat treatment may be carried out several times in sequence prior to the final removal of residuals of seed layer material 11 that, in this case, functions as a stiffening means to further avoid buckling.

In a further alternative, heat treatment is performed for the entire structure comprising first support substrate 17, first buried layer 15, strained material islands 14, second buried (that may also be compliant layer) 18 and second support substrate 19 (see FIG. 2H). Second substrate 19, in this case, is providing a stiffening effect in order to further avoid buckling of strained material islands 14, which proves particularly advantageous for relatively large island sizes (e.g., 1 mm×1 mm and more).

It should also be noted that if seed layer 11 is GaN deposited on a sapphire substrate, detachment by laser lift off at the interface of the GaN layer and the sapphire substrate can also be performed during the process of transfer of the strained material islands. Moreover, if seed layer 11 is a silicon wafer and detachment is achieved by the SMART CUT® process, the substrate 17 advantageously is a silicon substrate to obtain similar coefficients of thermal expansion thermal treatment.

In the following, an example of the formation of an epitaxial layer of InGaN, useful for the manufacture of LEDs, lasers or solar cells, based on the relaxation and transfer of a strained layer in accordance with the present invention is described.

First, a strained InGaN layer comprising 5-7% indium and of a thickness of about 100 nm is formed by heteroepitaxy on a GaN seed layer that have been deposited on a sapphire seed substrate (corresponding to reference sign 12 of FIG. 2A). An oxide layer of $SiO_2$ (or an undoped-silicon-glass) of a thickness of about 50 nm is deposited on the InGaN layer having gallium polarity to improve adherence with another substrate. A compliant layer of borophosilicate glass of a thickness of about 500 nm is subsequently formed on the oxide layer. The compliant layer preferably comprises about 4.5% by weight of boron and about 2% by weight of phosphorous to achieve the desired relaxing effect. Hydrogen ion implantation is performed through the free surface of the compliant layer in order to form a weakened layer in the GaN seed layer and then the surface is polished, for example, by a CMP technique. Ion implantation is carried out with $4 \times 10^{17}$ atoms/cm2 and ion energies (about 120 keV) sufficient to pass through the compliant layer, the oxide layer and the InGaN layer.

An absorbing layer of $Si_xN_y$:H of a thickness of about 150 nm is deposited on another sapphire substrate (corresponding to reference sign 17 of FIGS. 2E, G, and H) and a bonding layer of borophosilicate glass is subsequently formed on the nitride layer and polished prior to bonding to the weakened structure including the InGaN strain layer. The resulting entire borophosilicate glass layer can have a thickness of about 1 micrometer.

Next, fracture at the weakened layer and detachment of the initial sapphire seed layer together with the seed layer of GaN is achieved by thermal treatment at 450° C. for 10 hours. Note, that at this stage, the temperature is kept below the melting (reflow) temperature of the borophosilicate glass layer. After the heat treatment, the residual GaN seed material is dry etched to free the InGaN layer of N polarity. The InGaN layer is subsequently patterned to form trenches of depths of 10-40 nm in the borophosilicate glass layer by a standard lithography process.

In a next step, annealing treatment is performed at 800° C. for 4 hours to cause reflow of the borophosilicate glass layer and the corresponding relaxation of the strained InGaN islands (of about 100×100 to 300×300 micrometers$^2$) resulting from the patterning process. An SiN layer of a thickness of about 50 nm might be provided between the N face of the InGaN layer and the oxide layer of $SiO_2$ (or an undoped-silicon-glass) to improve adherence between the InGaN layer and the oxide layer. In this case, the SiN layer can also function as an absorbing layer that might be used for a detachment step.

An undoped-silicon-glass layer of a thickness of about 1 micrometer is deposited on a second sapphire substrate (corresponding to reference sign 19 of FIG. 2H). The combination of undoped-silicon-glass layers and the optional SiN layer form at least part of buried layer 18 of FIG. 2H. Before bonding of the undoped-silicon-glass layers polishing of the bonding surfaces is performed. The entire thickness of the bonded undoped-silicon-glass layer may be about 1 micrometer (after polishing). Detachment of the substrate to which the InGaN strain layer formed by heteroepitaxy was transferred in the first transfer step (see reference sign 17 of FIGS. 2E, G, and H) is achieved by electromagnetic irradiation by means of an Ar/F laser providing light of 193 nm to which the substrate is transparent. Residuals of the SiN, undoped-silicon-glass and borophosilicate glass layers are subsequently removed by polishing and etching.

The resulting structure comprising completely relaxed InGaN islands of gallium polarity can be used for the homoepitaxial growth of material layers that are suitable for the manufacture of electronic, photovoltaic or opto-electronic devices. For instance, epitaxy of an InGaN material with the same or comparable indium content as compared to the one of the relaxed InGaN islands can be performed.

The embodiments discussed herein are not intended as limitations but serve as examples illustrating features and advantages of the invention and of the scope of the invention. It is to be understood that some or all of the above described features can also be combined in different ways to achieve the goals of the invention. In particular, other embodiments will occur to those skilled in the art and are within the following claims.

The words "including", "comprising", "having", and "with" as used herein are to be interpreted broadly and comprehensively and are not limited to any physical interconnection. The articles "a" or "an" or the like are also to be interpreted broadly and comprehensively as referring to both the singular and the plural. A number of references are cited herein, the entire disclosures of which are incorporated herein, in their entirety, by reference for all purposes. Further, none of the cited references, regardless of how characterized above, is admitted as prior to the invention of the subject matter claimed herein.

What is claimed is:

1. A method for forming islands of an at least partially relaxed strained material on a target substrate comprising:
    forming islands from a strained material layer on an intermediate substrate;
    performing a first heat treatment so as to at least partially relax the strained material islands; and
    transferring the at least partially relaxed strained material islands to the target substrate, by:
        depositing a high-viscosity layer comprising a thermal oxide on the at least partially relaxed strained material islands; and
        bonding the high-viscosity layer to the target substrate.

2. The method of claim 1 wherein the high-viscosity layer comprises an absorption layer suitable for absorbing electromagnetic radiation.

3. The method of claim 1 wherein the intermediate substrate and the target substrate comprise the same material.

4. A method for forming islands of an at least partially relaxed strained material on a target substrate which comprises:
    forming islands from a strained material layer on an intermediate substrate by
        growing a strained material on a seed substrate;
        depositing a first low-viscosity layer on the strained material layer;
        bonding the first low-viscosity layer to the intermediate substrate; and
        transferring the strained material layer from the seed substrate to the intermediate substrate;
        depositing a second low-viscosity layer on the strained material; and
        patterning the second low-viscosity layer and the strained material; and
    performing a first heat treatment so as to at least partially relax the strained material of the formed islands.

5. The method of claim 4 further comprising patterning the strained material layer so as to form strained material islands separated by interspaces.

6. The method of claim 4 wherein the seed substrate, the intermediate substrate, and the target substrate comprise one or more of sapphire, silicon, SiC, and Ge, the strained material layer comprises InGaN, and the first low-viscosity layer comprises one or more of a compound or mixture of $SiO_2$ and boron, a compound or mixture of $SiO_2$ and phosphorous, and a borophosphosilicate glass, or both.

7. The method of claim 4 wherein the intermediate substrate and the target substrate comprise the same material.

8. The method of claim 4 wherein the first low-viscosity layer comprises an absorption layer suitable for absorbing electromagnetic radiation and wherein the seed substrate and the intermediate substrate comprise the same material.

9. The method of claim 4 wherein the depositing and patterning of the second low viscosity layer are conducted prior to the first heat treatment.

10. A method for forming islands of an at least partially relaxed strained material on a target substrate which comprises:
    forming islands from a strained material layer on an intermediate substrate by
        growing a strained material on a seed substrate;
        depositing a first low-viscosity layer on the strained material layer;
        bonding the first low-viscosity layer to the intermediate substrate;
        implanting ions in the seed substrate;
        detaching the strained material from the seed substrate at the weakened layer by a third heat treatment to transfer it to the intermediate substrate;
        patterning the strained material layer so as to form strained material islands separated by interspaces; and
    performing a first heat treatment so as to at least partially relax the strained material of the formed islands.

11. The method of claim 10 wherein the implanting is performed subsequent to patterning and deposition of the first low-viscosity layer so that ions are implanted below the strained material islands and in the first low-viscosity layer at the bottom of the interspaces separating the strained material islands.

12. The method of claim 10 wherein the implanting is performed prior to patterning and deposition of the first low-viscosity layer.

13. The method of claim 10 wherein the seed substrate, the intermediate substrate, and the target substrate comprise one or more of sapphire, silicon, SiC, and Ge, the strained material layer comprises InGaN, and the first low-viscosity layer comprises one or more of a compound or mixture of $SiO_2$ and boron, a compound or mixture of $SiO_2$ and phosphorous, and a borophosphosilicate glass, or both.

14. The method of claim 10 wherein the first low-viscosity layer comprises an absorption layer suitable for absorbing electromagnetic radiation and wherein the seed substrate and the intermediate substrate comprise the same material.

15. A method for forming islands of an at least partially relaxed strained material on a target substrate which comprises:
    forming islands from a strained material layer on an intermediate substrate by:
        growing a strained material on a seed substrate;
        depositing a first low-viscosity layer on the strained material layer;
        bonding the first low-viscosity layer to the intermediate substrate; and
        transferring the strained material layer from the seed substrate to the intermediate substrate; and
        patterning the strained material layer so as to form strained material islands separated by interspaces; and
    performing a first heat treatment so as to at least partially relax the strained material of the formed islands;
    wherein the first low-viscosity layer is deposited subsequent to the patterning such that the first low-viscosity layer is deposited on the islands of strained material and in the interspaces separating the strained material islands.

16. The method of claim 15 wherein the seed substrate, the intermediate substrate, and the target substrate comprise one or more of sapphire, silicon, SiC, and Ge, the strained material layer comprises InGaN, and the first low-viscosity layer comprises one or more of a compound or mixture of $SiO_2$ and boron, a compound or mixture of $SiO_2$ and phosphorous, and a borophosphosilicate glass, or both.

17. The method of claim 15 wherein the high-viscosity layer comprises an absorption layer suitable for absorbing electromagnetic radiation.

18. A method for forming islands of an at least partially relaxed strained material on a target substrate which comprises:
    forming islands from a strained material layer on an intermediate substrate by
        growing a strained material on a seed substrate;

depositing a first low-viscosity layer on the strained material layer;

bonding the first low-viscosity layer to the intermediate substrate; and transferring the strained material layer from the seed substrate to the intermediate substrate; and patterning the strained material layer so as to form strained material islands separated by interspaces; and performing a first heat treatment so as to at least partially relax the strained material of the formed islands;

wherein the patterning is performed subsequent to transferring to the intermediate substrate such that the interspaces extend down to the intermediate substrate with substantially no material of the first low-viscosity layer remaining on the bottoms of the interspaces.

19. The method of claim 18 wherein the seed substrate, the intermediate substrate, and the target substrate comprise one or more of sapphire, silicon, SiC, and Ge, the strained material layer comprises InGaN, and the first low-viscosity layer comprises one or more of a compound or mixture of $SiO_2$ and boron, a compound or mixture of $SiO_2$ and phosphorous, and a borophosphosilicate glass, or both.

* * * * *